(12) United States Patent
Sule et al.

(10) Patent No.: US 10,714,186 B2
(45) Date of Patent: Jul. 14, 2020

(54) METHOD AND APPARATUS FOR DYNAMICALLY DETERMINING START PROGRAM VOLTAGES FOR A MEMORY DEVICE

(71) Applicant: Intel Corporation, Santa Clara, CA (US)

(72) Inventors: Purval Shyam Sule, Folsom, CA (US); Aliasgar S. Madraswala, Folsom, CA (US); Shantanu R. Rajwade, Sunnyvale, CA (US); Trupti Ramkrishna Bemalkhedkar, Folsom, CA (US); Leonard Aaron Turcios, Folsom, CA (US); Kristopher H. Gaewsky, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/291,142

(22) Filed: Mar. 4, 2019

(65) Prior Publication Data

US 2019/0304543 A1 Oct. 3, 2019

Related U.S. Application Data

(63) Continuation of application No. 15/720,984, filed on Sep. 29, 2017, now Pat. No. 10,224,107.

(51) Int. Cl.
*G11C 7/02* (2006.01)
*G11C 16/12* (2006.01)
*G11C 11/56* (2006.01)
*G11C 16/10* (2006.01)
*G11C 16/34* (2006.01)
*G11C 16/04* (2006.01)

(52) U.S. Cl.
CPC .......... *G11C 16/12* (2013.01); *G11C 11/5628* (2013.01); *G11C 16/10* (2013.01); *G11C 16/0483* (2013.01); *G11C 16/3459* (2013.01)

(58) Field of Classification Search
CPC . G11C 16/0483; G11C 11/5628; G11C 16/10; G11C 16/3459; G11C 16/3454; G11C 16/3468; G11C 16/349; G11C 16/12; G11C 11/5635; G11C 16/14; G11C 16/16; G11C 16/26
USPC ............ 365/185.17, 185.19, 185.12, 185.18, 365/185.22
See application file for complete search history.

(56) References Cited

U.S. PATENT DOCUMENTS 9,703,494 B1 * 7/2017 Rajwade ............. G11C 11/5628
2011/0007562 A1 1/2011 Yip

* cited by examiner

*Primary Examiner* — Thong Q Le
(74) *Attorney, Agent, or Firm* — Alliance IP, LLC

(57) ABSTRACT

In one embodiment, an apparatus comprises a memory comprising a first group of memory cells, a second group of memory cells, and a controller to program one or more lower pages of data to the first group of memory cells; store dynamic start voltage information, the dynamic start voltage information indicative of a rate of programming of at least a portion of the first group of memory cells; determine a start program voltage based on the dynamic start voltage information; and apply the start program voltage to the second group of memory cells during a first program pass of a program operation, the program operation to program one or more lower pages of data to the second group of memory cells.

20 Claims, 8 Drawing Sheets

METHOD AND APPARATUS FOR DYNAMICALLY DETERMINING START PROGRAM VOLTAGES FOR A MEMORY DEVICE

CROSS-REFERENCE TO RELATED APPLICATIONS

This application is a continuation of U.S. application Ser. No. 15/720,984, filed Sep. 29, 2017. The disclosure of the prior application is considered part of (and is incorporated by reference in) the disclosure of this application.

FIELD

The present disclosure relates in general to the field of computer development, and more specifically, to memory programming.

BACKGROUND

A computer system may include one or more central processing units (CPUs) that may be coupled to one or more storage devices. A CPU may include a processor to execute software that utilizes the storage devices coupled to the CPU. The software may write data to the storage devices and read data from the storage devices. The data may be stored by the storage devices in a plurality of memory cells (e.g., NAND flash memory cells) of the storage devices.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
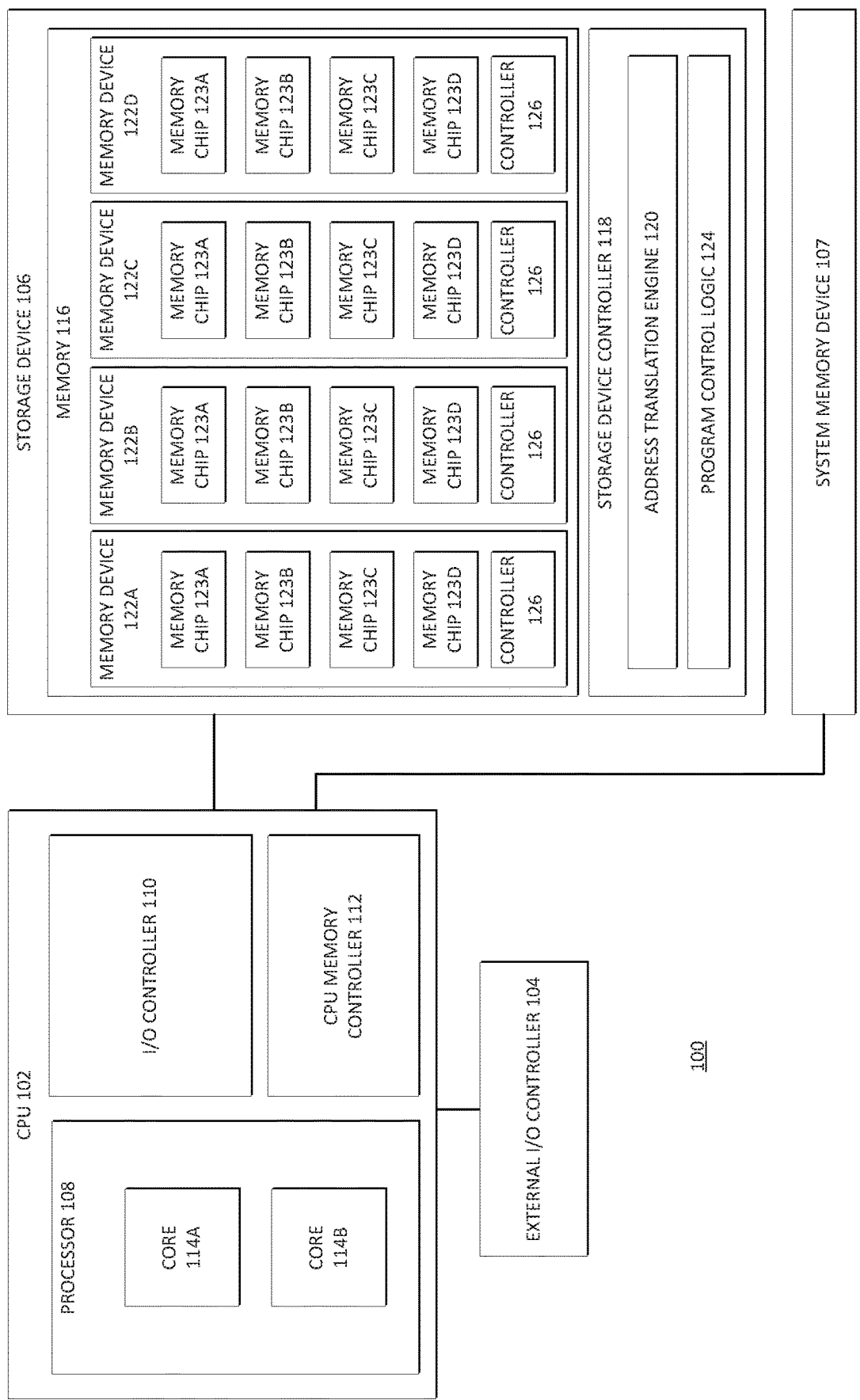
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, storage device 106, and system memory device 107. During operation, data may be transferred between storage device 106 or system memory device 107 and the CPU 102. In various embodiments, particular data operations (e.g., erase, program, and read operations) involving a storage device 106 or system memory device 107 may be managed by an operating system or other software application executed by processor 108.

Dynamic start voltage (DSV) sampling may refer to a determination of the program state of a group of cells based on one or more applied program voltages in order to predict an optimal start program voltage for the programming of one or more logical pages into a physical page of a memory. Performing DSV sampling on each page may lead to non-uniform write times on the upper page(s) programmed into the physical pages as well as limit the ability to cache upper page(s) while the DSV sampling is occurring.

Various embodiments of the present disclosure provide a system to perform DSV sampling on a physical page and store the DSV sampling information to determine program start voltages for lower page programming on other physical pages (e.g., on the same wordline) as well as upper page programming on the physical page that was sampled as well as other physical pages. Various embodiments may reduce programming time and maintain uniform write time across cells of an array. Particular embodiments may allow the implementation of dual I/O caching and decrease the probability of incorrectly sampling the behavior of a lower page program.

In various embodiments, a storage device 106 comprises NAND flash memory (herein a storage device comprising NAND flash memory is referred to as a NAND flash storage device). In some embodiments, storage device 106 may be a solid-state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 106 may include any number of memories 116 and each memory 116 may include any number of memory devices 122 (e.g., 122A-D). In a particular embodiment, a memory device 122 may be or comprise a semiconductor package with one or more memory chips 123 (e.g., memory chips 123A-D). In the embodiment depicted, memory 116 includes memory devices 122A-D (while specific references herein may be made to memory device 122A, the other memory devices may have any suitable characteristics of memory device 122A) and memory device controller 126.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences)

that remains stored even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random-access memory (DRAM) or static random-access memory (SRAM). One particular type of DRAM that may be used in a memory array is synchronous dynamic random-access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A memory device 122A includes a plurality of memory cells that are each operable to store one or more bits. The cells of a memory device 122A may be arranged in any suitable fashion, such as in rows (e.g., wordlines) and columns (e.g., bitlines), three dimensional structures, and/or other manner. In various embodiments, the cells may be logically grouped into banks, blocks, sub-blocks, planes, wordlines, pages, frames, bytes, or other suitable groups. In various embodiments, a memory device 122A comprises one or more NAND flash memory arrays.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

In a particular embodiment, a memory device 122 is a semiconductor package. In various embodiments, a semiconductor package may comprise a casing comprising one or more semiconductor dies (also referred to as chips) (e.g., memory chips 123A-D). A package may also comprise contact pins or leads used to connect to external circuits. However, a package is merely one example form a memory device 122 may take as a memory device may be any suitable arrangement of one or more memory arrays and associated logic in any suitable physical arrangement. For example, although a single physical package may include a single memory device 122, multiple memory devices 122 could be resident on a single package or a memory 122 could be spread across multiple packages.

A memory 116 may be embodied in one or more different physical mediums, such as a circuit board, die, disk drive, other medium, or any combination thereof (or combination with one or more packages). In a particular embodiment, memory 116 comprises a circuit board coupled to a plurality of memory devices 122 that each comprise a semiconductor package.

Storage device 106 may comprise any suitable type of memory and is not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory devices(s) and/or memory chip(s) thereof), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located, one or more pages of the physical memory location, one or more subblocks of the physical memory location, one or more wordlines of the physical memory location, one or more bitlines of the physical memory location, or other suitable identifiers or encodings thereof.

In various embodiments, the storage device 106 also includes program control logic 124 which alone or in combination with a memory device controller 126 is operable to control the programming sequence performed when data is written to a memory 116, the read sequence performed when data is read from a memory 116, or an erase sequence when data is erased from a memory 116. In various embodiments, program control logic 124 may provide the various voltages (or information indicating which voltages should be provided) that are applied to one or more memory cells, wordlines, bitlines, and/or other portions of a memory array during the programming, reading, and/or erasing of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all, or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
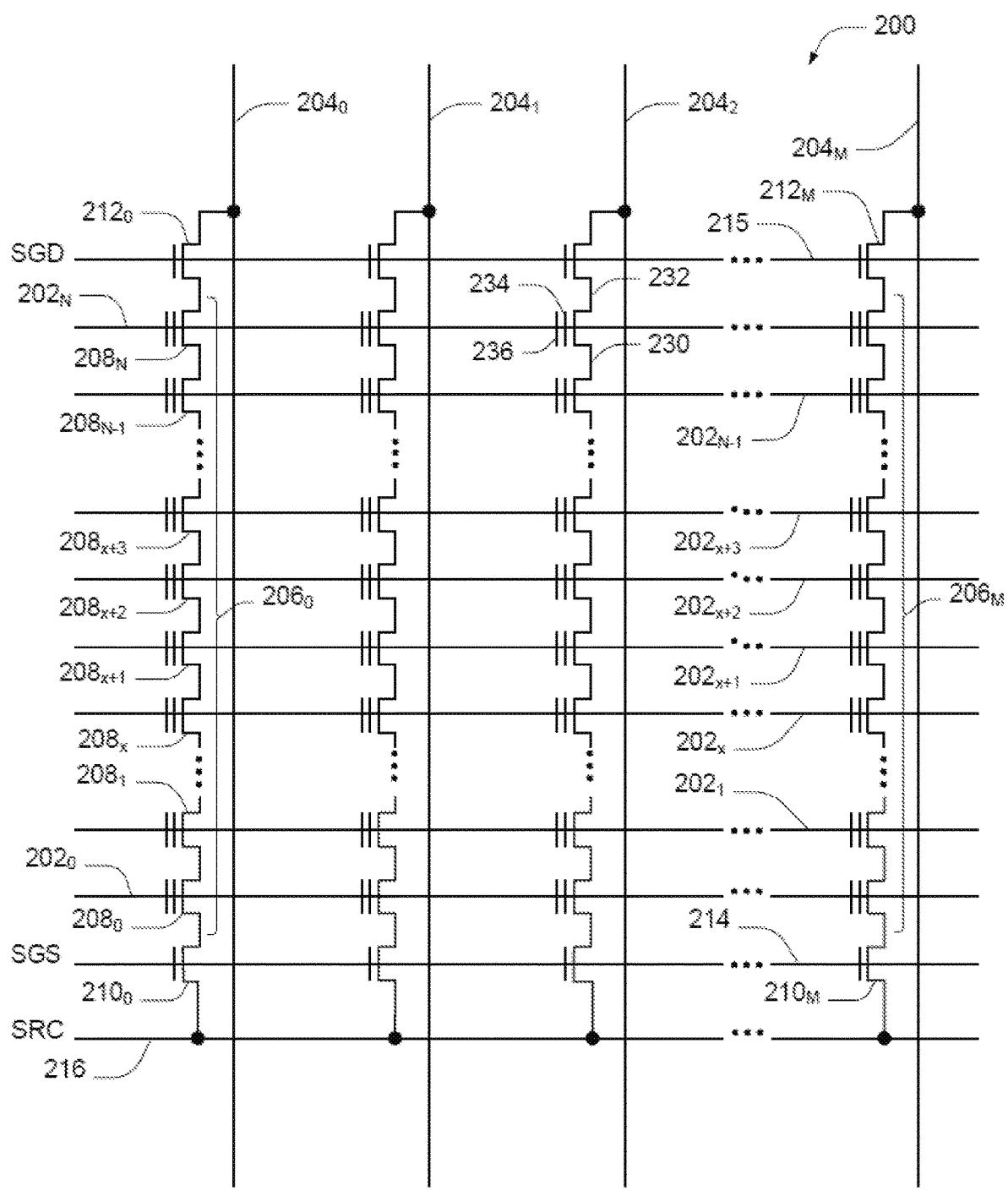
FIG. 2 illustrates an example portion of a NAND flash memory array in accordance with certain embodiments.

FIG. 2 illustrates an example portion of a NAND flash memory array 200 in accordance with certain embodiments. In various embodiments, memory device 122A includes an array 200 of memory cells logically arranged in rows and columns. Memory cells of a logical row are typically connected to the same access line (commonly referred to as a word line) while memory cells of a logical column are typically selectively connected to the same data line (commonly referred to as a bit line). In some embodiments, a single access line may be associated with more than one logical row of memory cells and a single data line may be associated with more than one logical column. Memory cells of the array are capable of being programmed to one of at least two data states (i.e., program levels).

Memory array 200 includes access lines, such as word lines $202_0$ to $202_N$, and data lines, such as bit lines $204_0$ to $204_M$. In some embodiments, the word lines 202 may be connected to global access lines (e.g., global word lines) in a many-to-one relationship.

Memory array 200 may be arranged in rows (each corresponding to a word line 202) and columns (each corresponding to a bit line 204). Each column may include a string of series-connected memory cells, such as one of NAND strings $206_0$ to $206_M$. Each NAND string 206 may be connected (e.g., selectively connected) to a common source 216 and may include a plurality of memory cells. For example, NAND string $206_0$ includes memory cells $208_0$ to $208_N$. The memory cells 208 represent non-volatile memory cells for storage of data. The memory cells 208 of each NAND string 206 may be connected in series between a select transistor 210 (e.g., a field-effect transistor), such as one of the select transistors $210_0$ to $210_M$ (e.g., that may each be a source select transistor, commonly referred to as select gate source), and a select transistor 212 (e.g., a field-effect transistor), such as one of the select transistors $212_0$ to $212_M$ (e.g., that may each be a drain select transistor, commonly referred to as select gate drain). Select transistors $210_0$ to $210_M$ may be commonly connected to a select line 214, such as a source select line, and select transistors $212_0$ to $212_M$ may be commonly connected to a select line 215, such as a drain select line. In a particular embodiment, a drain select line may be coupled to the drain select transistors of an entire subblock (and each subblock may have its own drain select line) while a source select line may be coupled to the source select transistors of an entire block (and each block may have its own source select line).

A source of each select transistor 210 may be connected to common source 216. The drain of each select transistor 210 may be connected to a memory cell $208_0$ of the corresponding NAND string 206. For example, the drain of select transistor $210_0$ may be connected to memory cell $208_0$ of the corresponding NAND string $206_0$. Therefore, each select transistor 210 may be configured to selectively couple a corresponding NAND string 206 to common source 216. A control gate of each select transistor 210 may be connected to select line 214.

The drain of each select transistor 212 may be connected to the bit line 204 for the corresponding NAND string 206. For example, the drain of select transistor $212_0$ may be connected to the bit line $204_0$ for the corresponding NAND string $206_0$. The source of each select transistor 212 may be connected to a memory cell of the corresponding NAND string 206. For example, the source of select transistor $212_0$ may be connected to memory cell $208_N$ of the corresponding NAND string $206_0$. Therefore, each select transistor 212 may be configured to selectively connect a corresponding NAND string 206 to a corresponding bit line 204. A control gate of each select transistor 212 may be connected to select line 215.

The memory array in FIG. 2 may be a quasi-two-dimensional memory array and may have a generally planar structure, e.g., where the common source 216, NAND strings 206 and bit lines 204 extend in substantially parallel planes. Alternatively, the memory array in FIG. 2 may be a three-dimensional memory array, e.g., where NAND strings 206 may extend substantially perpendicular to a plane containing the common source 216 and to a plane containing the bit lines 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a word line 202.

A column of the memory cells 208 is one or more NAND strings 206 selectively connected to a given bit line 204. A row of the memory cells 208 are memory cells commonly connected to a given word line 202. A row of memory cells 208 may, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line 202N and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line may be deemed a physical page. For particular memory devices, all memory cells of a particular subblock commonly connected to a given word line may be deemed a physical page. For example, memory cells that are coupled to a particular wordline in a subblock may comprise a first physical page, memory cells that are coupled to the particular wordline in a second subblock may comprise a second physical page, and so on. A bit from each memory cell of a physical page may be deemed a logical page. Thus, a single physical page may store multiple logical pages (e.g., a TLC scheme may store three logical pages in a single physical page).

In sensing (e.g., reading) a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) may be applied to the control gate of memory cell $208_{x+1}$ while voltage levels are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. A sense operation that determines whether the memory cell $208_{x+1}$ is activated in response to one or sense voltages may indicate one or more bits of the data state stored in that memory cell. In various embodiments, each memory cell 208 can be programmed according to an SLC, MLC, TLC, a QLC, or other encoding scheme. Each cell's threshold voltage (Vt) is indicative of the data that is stored in the cell.

Although various embodiments have been described with respect to a particular type of memory array (e.g., a NAND flash memory array), the teachings of the various embodiments may be equally applicable to any type of memory arrays (e.g., AND arrays, NOR arrays, etc.), including those recited herein or similar memory arrays.

Figure 3:
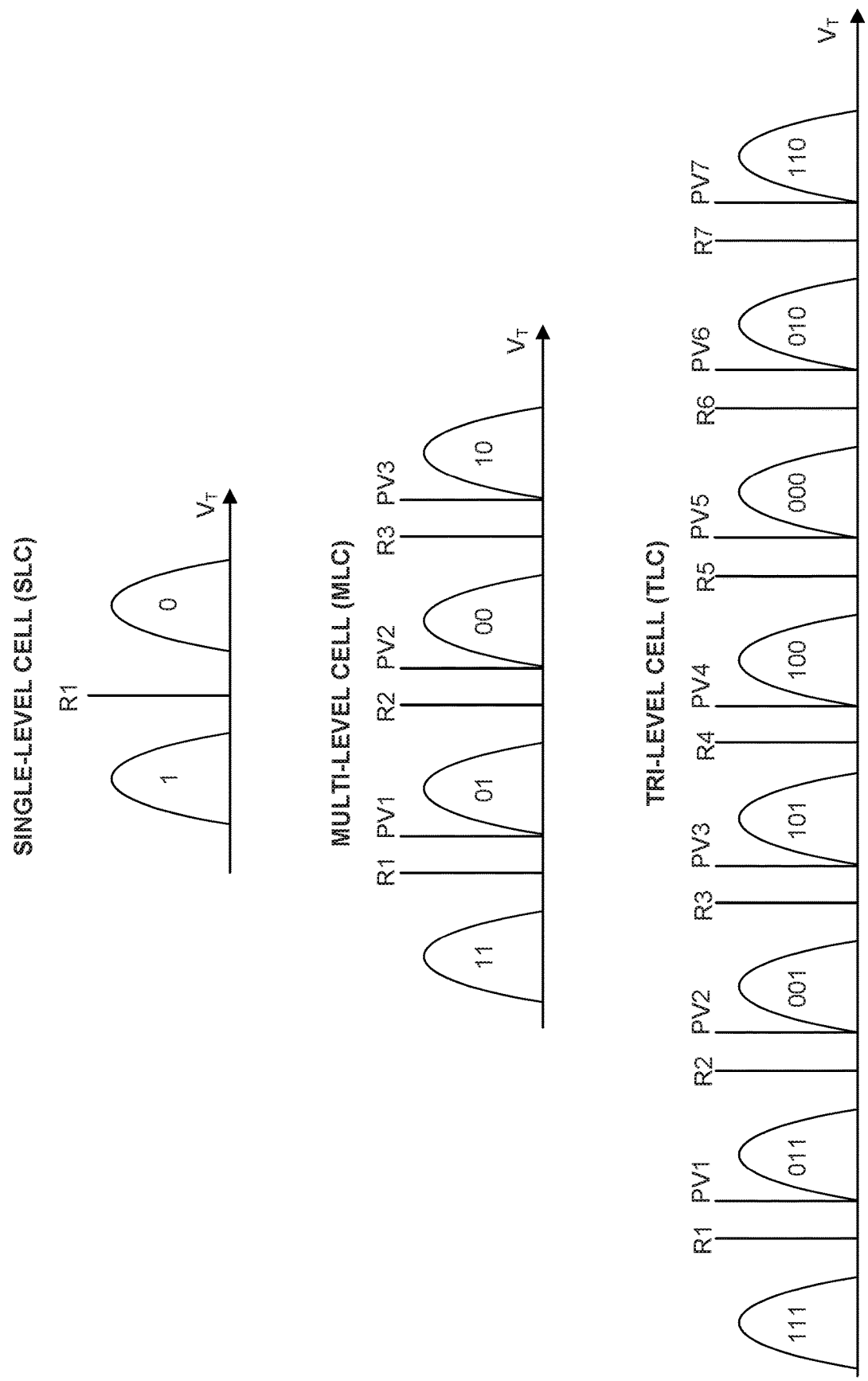
FIG. 3 illustrates example encodings of bits within NAND flash memory cells in accordance with certain embodiments.

FIG. 3 illustrates example encodings of bits within NAND flash memory cells 208 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted elliptical regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a wordline when the values of cells coupled to that wordline are being read. When a particular read voltage is applied, sense circuitry may determine whether the threshold value of a cell is greater than or less than the read voltage based on a voltage or current sensed by the sense circuitry via the bitline of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during programming of the cell (e.g., during a program verify operation) to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droopage over time and to improve sensing accuracy. For example, the figure depicts a margin between R1 and PV1, a margin between R2 and PV2, and so on.

In particular embodiments, cells may be programmed one or more pages (e.g., logical pages) at a time, where a page is stored in a group of cells (e.g., a physical page) that are coupled to the same wordline. For example, the group of cells that is programmed may be identified by a particular wordline and a particular subblock. The group of cells may store one page of data (if the cells are encoded according to an SLC scheme) or multiple pages of data (if the cells are encoded according to an MLC, TLC, QLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different cells of a wordline (e.g., a physical page). For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A programming sequence for a group of cells may comprise programming all of the intended pages into the group of cells. A programming sequence may include one or more programming passes. A programming pass (which may comprise one or more programming loops) may encode one or more pages. A programming pass may comprise the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). In some embodiments, one or more loops of a programming pass may comprise the application of one or more effective program voltages without the application of one or more verify voltages. The application of an effective program voltage to a cell may include changing the voltage difference between a control gate and a channel of the cell in order to change the threshold voltage of the cell. Thus, the voltage of a wordline (coupled to the control gate of the target cell) and/or a channel of the cell may be set in order to effectuate application of an effective program voltage. As a "program voltage" is commonly used to refer to a voltage applied to a wordline, the term "effective program voltage" is used herein to refer to the voltage difference between a control gate and channel of a cell (which in instances where the channel is held at 0 V will be synonymous with program voltage). Reference herein to a start program voltage may refer to either a program voltage or an effective program voltage.

As mentioned above, a programming pass may program one or more pages. For example, when the cells of a wordline are encoded using an MLC scheme, both pages (the LP and the UP) may be programmed during a single programming pass by setting the voltage levels of the cells to the desired program level (e.g., within one of the four voltage ranges depicted for the MLC scheme in FIG. 3). Alternatively, an LP could be programmed in a first pass and a UP could be programmed in a second pass. For example, during the first pass, first bits of the cells (where the first bits of the cells collectively form the LP) may be programmed to a binary state based on the desired value of each bit. For example, referring to the MLC scheme depicted in FIG. 3, if the rightmost bits of the cells form the LP, and a particular rightmost bit is to be programmed to a '0' value, the Vt of the cell may be programmed to a value that is slightly greater than PV2 in the first programming pass (or at least a portion of the way to PV2 so as to be distinguished from cells that are left in a low voltage erased state). If a particular rightmost bit is to be stored as a '1' value, it may be left at a low voltage level. During the second pass, second bits of the same cells (where the second bits of the cells collectively form the UP) are programmed, resulting in the Vt of the cells being changed to their desired Vt (e.g., within one of the four voltage ranges depicted for the MLC scheme in FIG. 3), thus storing values for the UP and the LP. As other examples, when the cells of a wordline are encoded using a TLC scheme or a QLC scheme, all pages may be programmed during a single programming pass by setting the voltage levels of the cells to the desired program level, or one or more of the pages may be programmed during a first pass and the remaining pages programmed during a second pass (or the remaining pages may be programmed using multiple additional passes). For example, in a TLC scheme, a first pass may encode an LP and a second pass may encode the UP and the XP. As another example, in a QLC scheme, a first pass may encode an LP and a UP and a second pass may encode the XP and the TP or a first pass may encode the LP and a second pass may encode the UP, XP, and TP.

As used herein, "lower page(s)" may be used to refer to one or more pages that are programmed in a first programming pass and "upper page(s)" may be used to refer to one or more pages that are programmed in one or more subsequent programming passes. These designations may be distinguished from the Lower Page and Upper Page previously described (in general a Lower Page will be a lower page as used herein when multiple programming passes are used while an Upper Page may be a lower page or an upper page depending on whether it is programmed in the first programming pass or in a subsequent programming pass). Thus, in an MLC scheme, a lower page (e.g., the LP) may be programmed in a first programming pass and an upper page (e.g., the UP) may be programmed in a second programming pass (this may also be referred to as 2-4 programming, as the cells are programmed to two levels in the first pass and four levels in the second pass). As another example, in a TLC scheme, a lower page (e.g., the LP) may be programmed in a first programming pass and upper pages (e.g., the UP and the XP) may be programmed in a second programming pass (this may be referred to as 2-8 programming). As another example, in a TLC scheme, lower pages (e.g., the LP and the UP) may be programmed in a first programming pass and an upper page (e.g., the XP) may be programmed in a second programming pass (this may be referred to as 4-8 programming). As another example, in a TLC scheme, lower pages (e.g., the LP, the UP, and the XP) may be programmed coarsely in a first programming pass and the upper page (e.g., the XP) may be read out and programmed again in a more precise manner in a second programming pass (this may be referred to as 8-8 programming). As another example, in a QLC scheme, a lower page (e.g., the LP) may be programmed in a first programming pass and upper pages (e.g., the UP, XP, and TP) may be programmed in a second programming pass (this may be referred to as 2-16 programming). As another example, in a different QLC scheme, lower pages (e.g., the LP and the UP) may be programmed in a first programming pass and upper pages (e.g., the XP and the TP) may be programmed in a second programming pass (this may be referred to as 4-16 programming). As another example, in a different QLC scheme, lower pages (e.g., the LP, the UP, and the XP) may be programmed in a first programming pass and an upper page (e.g., the TP) may be programmed in a second programming pass (this may be referred to as 8-16 programming). Any other suitable permutations of pages programmed in programming passes is contemplated in this disclosure including multiple passes being used to program the upper pages.

In particular embodiments, a logical page of data (which may correspond to a page of data referred to by a computing host such as CPU 102) may correspond to an LP, UP, XP, TP, or other page of memory stored in cells that are encoded with multiple bits. Accordingly, two logical pages of data may correspond to an LP and a UP stored in a group of cells encoded using an MLC scheme, three logical pages of data may correspond to an LP, UP, and XP stored in a group of cells encoded using a TLC scheme, four logical pages of data may correspond to an LP, UP, XP, and TP stored in a group of cells encoded using a QLC scheme, and so on. Thus, when a computing host writes to storage device 106, if multiple pages are to be programmed in a single pass, multiple logical pages from the computing host may be aggregated and programmed in the pass. For example, in memory encoded using a TLC scheme, when the LP and UP are programmed in a single pass, two logical pages of data may be aggregated (where one logical page is stored in the LP and one logical page is stored in the UP).

In particular embodiments, if multiple programming passes are used to program the cells of a first wordline, one or more programming passes may be performed on one or more adjacent wordlines after an initial programming pass is performed on the first wordline and before an additional programming pass is performed on the first wordline. Such embodiments may mitigate the effects of interference caused to cells by the programming of neighboring wordlines. In other embodiments, multiple passes may be performed on the cells of a wordline before the next wordline is programmed.

A single-pulse programming (SPP) scheme may utilize a waveform with a single program pulse which is applied to cells (e.g., via a wordline of the cells) to move the Vts of all the cells that are below their destined program verify voltage (i.e., the cells that have not yet reached their targeted program level). A multi-pulse programming (MPP) scheme may apply two (or more) effective program voltages to cells during a single program loop, where each effective program voltage is applied to a group of cells targeted towards different program levels. Thus, a typical program loop in an MPP scheme may involve application of a first effective program voltage to a first group of cells, then application of a second effective program voltage to a second group of cells, then activation of additional effective program voltages to additional groups of cells (if applicable), and then application of one or more program verify voltages to determine which cells have reached their targeted voltage levels. In various embodiments, one or more of the MPP program loops may omit the application of the program verify voltages.

As described above, an effective program voltage may be used herein to refer to the channel-to-control gate voltage difference applied to one or more cells. Thus, if a channel is not boosted (but is held at 0V), the effective program voltage is equal to the program voltage applied to the wordline and if a channel is boosted, the effective program voltage is equal to the difference between the program voltage applied to the wordline and the voltage of the channel. In a single pulse programming scheme, only a single effective program voltage is applied during a program loop to cells being programmed during that loop. In various embodiments, when a single page is programmed during a first pass, an SPP scheme may be used to program the page, and when one or more additional pages are programmed in a subsequent pass an MPP scheme may be used to program the one or more additional pages.

Figure 4:
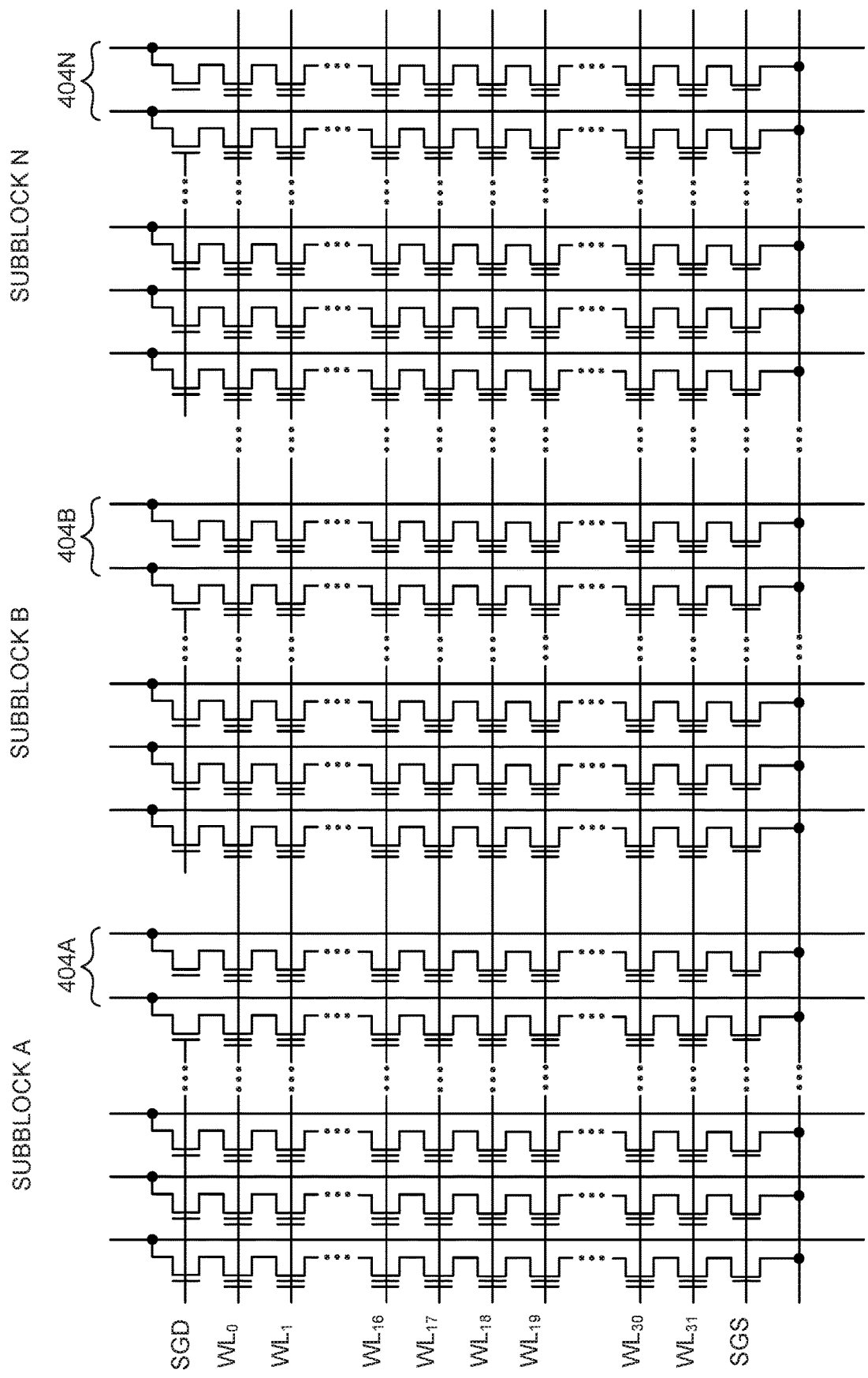
FIG. 4 illustrates example subblocks of a block of a memory device in accordance with certain embodiments.

FIG. 4 depicts memory cells of a memory array arranged into a plurality of subblocks (subblocks A-N) in accordance with certain embodiments. In a particular embodiment, memory cells of an array 200 of chip 123 may be arranged into subblocks and blocks. As an example, a subblock may comprise a number of series strings and a block may comprise a number of subblocks. In various embodiments, a source select line (controlled by source gate select signal SGS) is shared by each series string of a block and each series string of a particular subblock shares a drain select line (controlled by drain gate select signal SGD) with each subblock having its own drain select line.

In a particular embodiment, a subblock may contain a single physical page of memory for each wordline of the subblock (in other embodiments, a subblock may contain multiple physical pages of memory for each wordline). Thus, a block of memory may be divided into a large number of physical pages. As described above, a logical page may be a unit of programming or reading that contains a number of bits equal to the number of cells in a physical page. In a memory that stores one bit per cell (e.g., an SLC memory), one physical page stores one logical page of data. In a memory that stores two bits per cell (e.g., an MLC memory), a physical page stores two logical pages.

In various embodiments, a subblock may also include memory cells for storing metadata associated with the physical page. For example, in the embodiment depicted, each subblock includes multiple sets of dynamic start voltage (DSV) cells 404. A set of DSV cells may be coupled to a corresponding wordline and may include DSV information (i.e., information indicative of an optimal start program voltage for a physical page of that wordline). In various embodiments, the DSV cells associated with a physical page may be programmed along with (e.g., during the same programming pass as) the physical page. Thus, the set of DSV cells 404A that are coupled to $WL_0$ may be programmed along with the other memory cells of subblock A that are coupled to $WL_0$.

Figure 5:
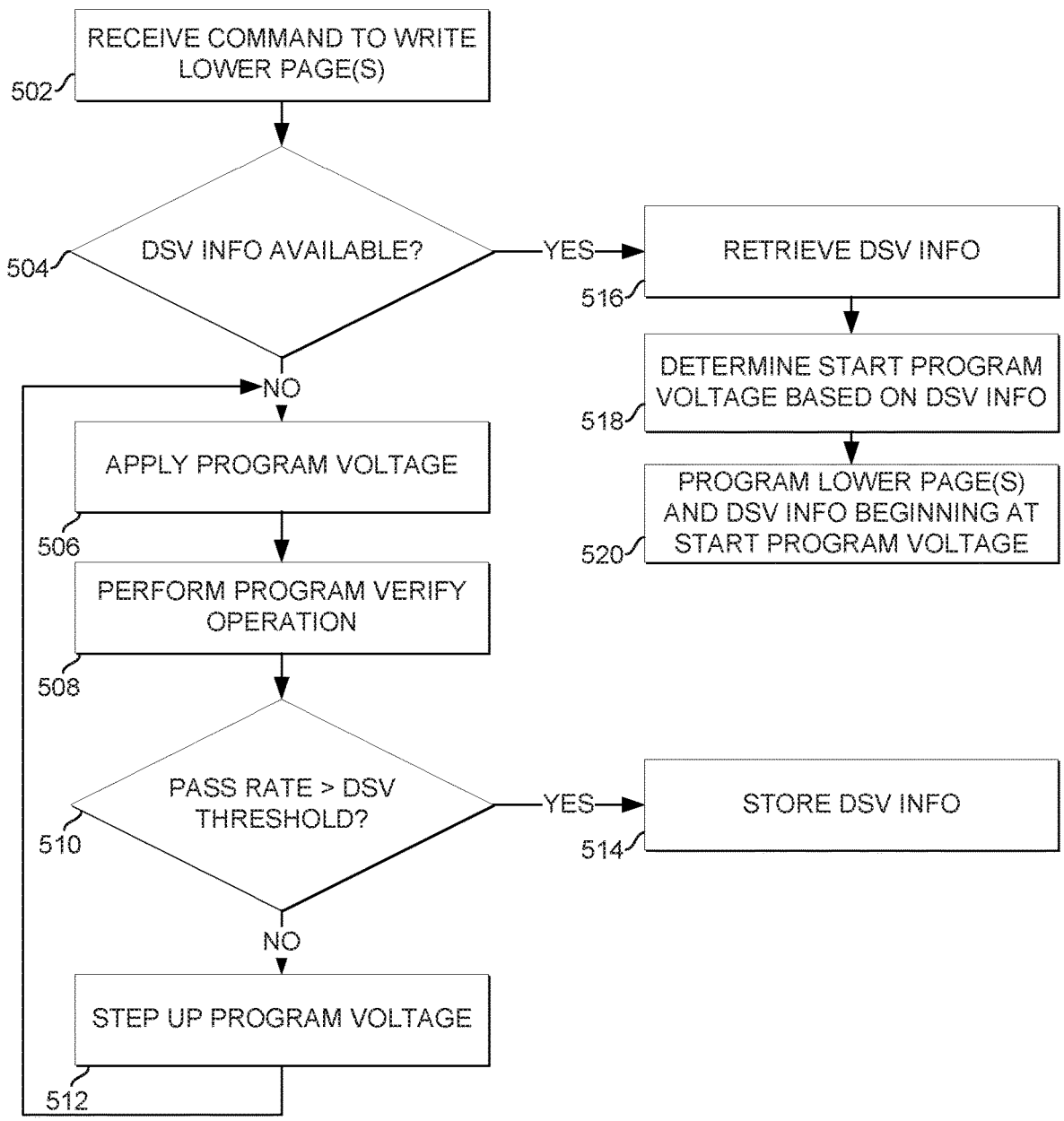
FIG. 5 illustrates an example flow for determining a start program voltage for programming one or more lower pages in accordance with certain embodiments.

FIG. 5 illustrates an example flow for determining a start program voltage for programming one or more lower pages in accordance with certain embodiments. At 502, a command to write one or more lower page(s) of data to a physical page is received. For purposes of explanation, referring to FIG. 4, a command to write at least one lower page of data to a physical page on $WL_0$ of subblock A will be assumed to have been received.

At 504, a determination is made as to whether DSV information associated with the physical page is available. In at least one embodiment, this may include accessing a DSV memory of a memory device 122 to determine whether the DSV memory includes an entry storing DSV information for the wordline of the physical page that is to be programmed. The DSV memory may be any suitable volatile or non-volatile memory. In a particular embodiment, the DSV memory is an SRAM. In various embodiments, when DSV information for a particular wordline is generated, the DSV information may be stored in the DSV memory. In a particular embodiment, the DSV memory may be dedicated to blocks of one memory chip 123 or may be shared by one or more memory chips 123. The DSV memory may have a plurality of entries that may be shared by various wordlines of one or more memory blocks. When the entries of the DSV memory are each occupied with DSV information and new DSV information is generated for a particular wordline, an entry of the DSV memory may be overwritten with the new DSV information.

In an alternative embodiment, each entry of the DSV memory may include DSV information for any suitable portion of a memory array. For example, an entry of the DSV memory may include DSV information for a plurality of consecutive wordlines or other suitable segment of a memory array. Thus, at 504, the DSV memory may be checked to determine whether it includes an entry storing DSV information for a segment of memory that includes the physical page to be programmed (e.g., for a group of wordlines that includes the wordline of the physical page).

When a determination is made that DSV information associated with the physical page is not available, the flow moves to 506. At 506, a program voltage is applied to the wordline. The program voltage may be a default start program voltage when no DSV information is available to aid the determination of the start program voltage. In various embodiments, a default start program voltage may be determined for an entire array or multiple default start program voltages may be determined for an array (e.g., a distinct start program voltage may be determined for each of a plurality of portions thereof, such as a group of wordlines) based on how quickly the Vt of the cells of the array (or portion thereof) change with respect to a change in a program voltage. In a particular embodiment, the default start program voltage(s) may be determined using a calibration process performed at the time of manufacture of the memory device or at any time thereafter. In a particular embodiment, each default start program voltage may also be based on a guardband voltage that protects against the overprogramming of fast-to-move cells.

At 508, a program verify operation is performed. The program verify operation may include applying one or more program verify voltages to the wordline and sensing the bitlines to determine whether the Vts of the memory cells have reached their intended programming levels (corresponding to the values of the lower page(s) to be programmed).

At 510, a determination is made as to whether a pass rate of the programmed cells is higher than a DSV threshold. In a particular embodiment, the pass rate measurement is confined to the pass rate of the cells that are to be programmed to the first program level. As the object of this determination is to determine an optimal start program voltage, the rate at which the cells reach the first program level is of particular relevance. In another embodiment, the pass rate may be the pass rate of cells to be programmed to a plurality of different program levels (e.g., all of the cells). In such embodiments, the DSV threshold may be lower than a DSV threshold in the embodiment in which the pass rate is confined to the cells that are to be programmed to the first level (since the majority of the failing cells will be cells that are to be programmed to program levels that are higher than the first program level). In any event, the pass rate and DSV threshold may provide an indication of how many memory cells of the physical page have reached a first program level.

The purpose of determining whether the pass rate of the programmed cells is higher than the DSV threshold is to determine an optimum start program voltage for the physical page based on how long (e.g., how many program loops) it takes to program memory cells to the first program level. A first program loop may comprise application of a first program voltage to the wordline for a specific period of time. The next program loop may comprise application of a second program voltage (which is higher than the first program voltage) to the wordline for a specific period of time (e.g., the same amount of time as the first program voltage is applied to the wordline). Each subsequent program loop may comprise application of a higher program voltage. The programming pass may end when the lower page(s) are deemed to be sufficiently programmed. In general (especially when multiple lower pages are programmed in the first pass), this may occur later than the determination that a pass rate of the programmed cells exceeds the DSV threshold. In general, when the pass rate considers all the cells of the page, the DSV threshold may be lower than a threshold that is used to determine whether the programming of the lower page(s) is complete.

At 512, if the pass rate is determined to be less than the DSV threshold, the program voltage is stepped up and the flow returns to 506, where the stepped-up program voltage is applied to the wordline. Another program verify operation is performed at 508 and then another determination as to whether the pass rate is greater than the DSV threshold is made at 510. As long as the pass rate is less than the threshold, the program voltage is stepped up and an additional program loop is performed.

Once the pass rate is determined to be greater than the DSV threshold at 510, DSV information is stored at 514. The DSV information may be based on the programming conditions at the time that the pass rate exceeded the DSV threshold. For example, the DSV information may be the program loop count at the time the DSV threshold was exceeded. As another example, the DSV information may be a program voltage at the time the DSV threshold was exceeded (which could be expressed as an offset between the default start program voltage and the final program voltage or as the actual final program voltage value). In various embodiments, the DSV information may form a basis for calculation of a start program voltage to be used for programming lower page(s) and/or upper page(s) into other physical pages which are similar to the physical page being programmed (e.g., physical pages on the same wordline, physical pages on a nearby wordline, physical pages in the same subblock, or other similar physical pages expected to have similar programming characteristics). The DSV information may also form a basis for calculation of a start program voltage to be used for programming upper page(s) into the programmed physical page and/or other similar physical pages.

At 514, the DSV information may be stored in the DSV cells 404A of subblock A that are coupled to $WL_0$ and/or in the DSV memory (which in some embodiments is a memory with low access latency, such as an SRAM).

When a subsequent command to write one or more lower pages is received, a determination of whether corresponding DSV information is available is made at 504 (and the DSV information is retrieved at 516 if it is available). For example, the DSV memory may be checked to see if the DSV memory has an entry storing DSV information that may be applied to the programming of the physical page to be programmed to store the one or more lower pages. For example, if each entry of the DSV memory corresponds to a wordline, then if the wordline of the physical page to be programmed has a valid entry in the DSV memory, the DSV information from that entry may be retrieved at 516. As another example, if each entry of the DSV memory corresponds to a group of wordlines, then if the wordline of the physical page to be programmed is a member of a group of wordlines that has a valid entry in the DSV memory, the DSV information from that entry may be retrieved at 516. In other examples, if the physical page to be programmed has a corresponding entry (that applies to any suitable segment of a memory array that includes the physical page) in the DSV memory, the corresponding DSV information from that entry may be retrieved at 516.

For purposes of explanation, it will be assumed that a command to write at least one lower page of data to $WL_0$ of subblock B is received and that each entry in the DSV memory applies to a single wordline. Accordingly, at 504, the DSV memory may be checked to see if it has an entry corresponding to $WL_0$. Because the previous write command resulted in an entry corresponding to $WL_0$ being stored in the DSV memory, DSV information is determined to be available at 504 and is retrieved at 516. In a particular embodiment, the DSV information is retrieved from the DSV memory (e.g., SRAM) prior to the first program loop being performed on the physical page being programmed to store the lower page(s).

At 518, a start program voltage is determined based on the DSV information. In one example where the DSV information includes the program loop count (e.g., at which the pass rate exceeded the DSV threshold), the start program voltage may be determined by multiplying the loop count by the program step voltage and adding the result to the default start program voltage. In various embodiments, the result of the product of the loop count and the program step voltage may be multiplied by a factor and then added to the default start program voltage. For example, if the factor is less than 1, the result may protect against overprogramming cells that change Vt relatively quickly. A similar result may be achieved by additionally or alternatively subtracting a guardband voltage from a result of the default start program voltage plus the product of the program loop count and the program step voltage. In other embodiments, the start program voltage may be determined based on the loop count in any other suitable manner. In another example where the DSV information includes an offset voltage, the offset voltage may be added to the default start program voltage to determine the start program voltage. Alternatively, the offset voltage may be multiplied by a factor before being added to the default start program voltage and/or a guardband voltage may be subtracted to generate the start program voltage. As yet another example, the DSV information may explicitly specify the start program voltage to be used (or a voltage specified by the DSV information may be adjusted to determine the start program voltage). In other embodiments, the DSV information may include any suitable information that forms a basis for a calculation of a start program voltage.

At 520, the lower page(s) and the DSV information are programmed beginning at the start program voltage. For example, the first program loop performed may include application of the determined start program voltage to the wordline (e.g., $WL_0$) of the physical page being programmed to program the lower page(s) into the physical page of subblock B and the DSV information into the DSV cells 404B coupled to $WL_0$. The program voltage may be stepped up after each program loop until the programming of the lower page(s) is complete.

In a particular embodiment, the lower pages of a wordline may be programmed in order. For example, after lower page(s) are programmed into the physical page of subblock A coupled to $WL_0$, lower page(s) may be programmed into the physical page of subblock B coupled to $WL_0$, and so on up to the physical page of subblock N coupled to $WL_0$. For each of the physical pages after the first page, the DSV information for the wordline ($WL_0$) may be available in the DSV memory. Thus, once the first physical page has been sampled and the DSV information determined, the DSV information may be used to determine the start program voltage for each physical page of $WL_0$. Thus, while the default start program voltage may be used on the first page, the same optimized start program voltage may be used to program lower page(s) into each other physical page of the wordline. When the first physical page of the next wordline ($WL_1$) is programmed, DSV information may be captured for that page and used to determine an optimized start program voltage that may be used when lower page(s) are programmed into the remaining physical pages of the wordline. The first physical page that is sampled for DSV information does not have to be in subblock A. Any suitable physical page of a wordline may result in the generation of DSV information that may be used for the other physical pages of the wordline.

Figure 6:
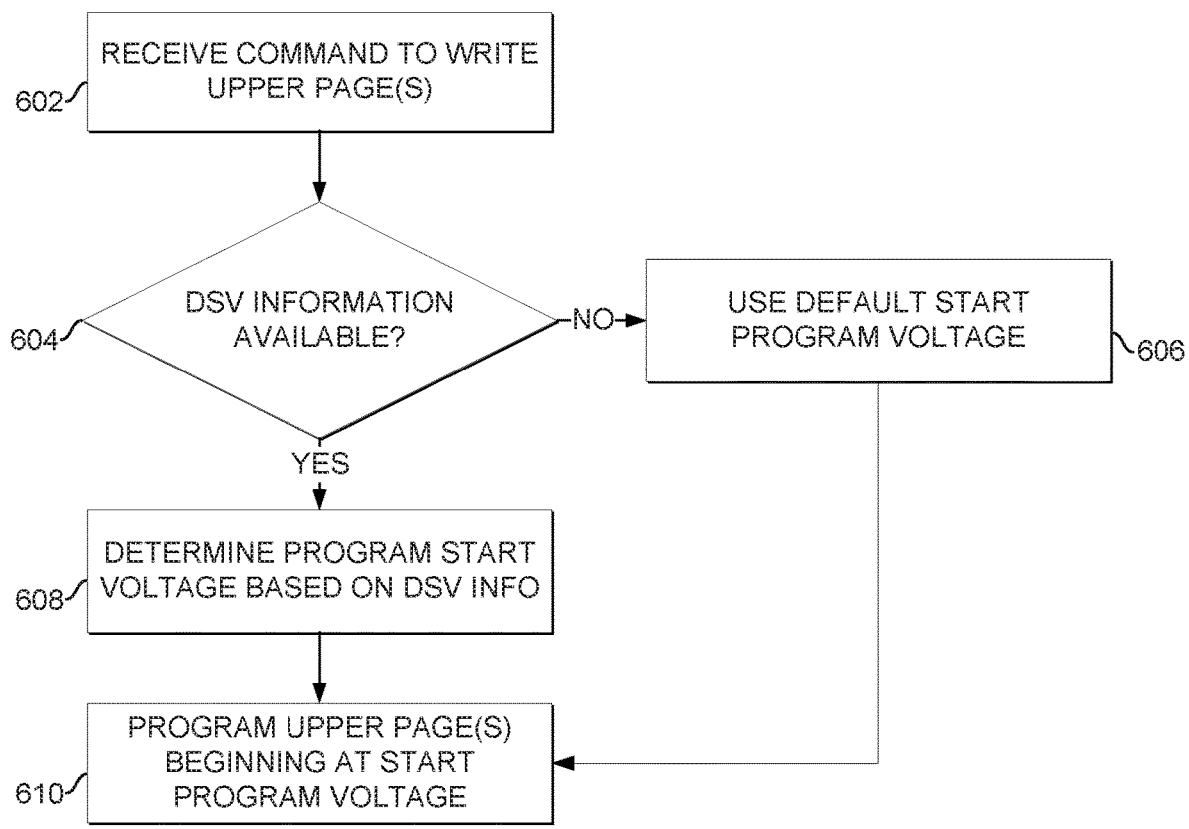
FIG. 6 illustrates an example flow for determining a start program voltage for programming one or more upper pages in accordance with certain embodiments.

FIG. 6 illustrates an example flow for determining a start program voltage for one or more upper pages in accordance with certain embodiments. As described earlier, the DSV information stored in DSV cells 404 associated with a physical page (e.g., DSV cells 404A coupled to $WL_0$) may be used to determine a start program voltage for programming one or more upper pages of the physical page (e.g., the physical page of subblock A coupled to $WL_0$). At 602, a command to write one or more upper page(s) of data to a physical page is received. For purposes of explanation, referring to FIG. 4, a command to write at least one upper page of data to a physical page on $WL_0$ of subblock A will be assumed to have been received.

At 604, a determination is made as to whether DSV information associated with the physical page is available. In at least one embodiment, this may include accessing DSV cells 404A of subblock A. In some embodiments, DSV cells 404A may be accessed at the same time a pre-read of the lower page(s) stored in the physical page is being programmed. The pre-read of the lower page(s) may include reading out the lower page(s) into one or more caches such that the lower page(s) may be used in combination with the upper page(s) to determine the target program level for each cell of the physical page. In an alternative embodiment, the programming of the upper page(s) could utilize DSV information found in the DSV memory (e.g., SRAM).

A determination of whether DSV information is available may be made in any suitable manner. For example, if all of the DSV cells 404A are in an erased state (e.g., all zeros), a determination may be made that the DSV information is not available. In an alternative embodiment, DSV information could include a valid bit that specifies whether the remainder of the DSV information is valid or not.

If the DSV information for the physical page is not available at 604, then a default start program voltage may be used at 606. In various embodiments, the default start program voltage used for programming upper page(s) may be equal to or different from the default start program voltage used for programming lower page(s). Similar to the default start voltage used for programming the lower page (s), the default start program voltage for the upper page(s) may be determined for an entire array or multiple default start program voltages may be determined for an array (e.g., a distinct voltage may be determined for each of a plurality of portions thereof, such as a group of wordlines) based on how quickly the Vt of the cells of the array (or portion thereof) change with respect to a change in a program voltage. Similar to the default start program voltage used for programming the lower page(s), the default start program voltage(s) for programming upper page(s) may be determined using a calibration process performed at the time of manufacture of the memory device or at any time thereafter. In a particular embodiment, each default start program voltage may also be based on a guardband voltage that protects against the overprogramming of fast-to-move cells.

At 610, the upper page(s) are programmed beginning at the start program voltage. That is, the first program loop performed includes application of the determined start program voltage to the wordline (e.g., $WL_0$) of the physical page being programmed to program the upper page(s) into the physical page. The program voltage may be stepped up after each program loop until the programming of the upper page(s) is complete.

At 604, if it is determined that DSV information is available, the flow moves to 608 where a start program voltage for the programming of the upper page(s) is determined based on the DSV information. In one example where the DSV information includes the program loop count (e.g., at which the DSV threshold was passed when the lower page(s) were programmed), the start program voltage for the upper page(s) may be determined by multiplying the loop count by the program step voltage and adding the result to the default start program voltage for the upper page(s). In various embodiments, the result of the product of the loop count and the program step voltage may be multiplied by a factor and then added to the default start program voltage. For example, if the factor is less than 1, the result may protect against overprogramming cells that change Vt relatively quickly. A similar result may be achieved by additionally or alternatively subtracting a guardband voltage from a result of the default start program voltage plus the product of the program loop count and the program step voltage. In other embodiments, the start program voltage for the upper page(s) may be determined based on the loop count in any other suitable manner. In another example where the DSV information includes an offset voltage, the offset voltage may be added to the default start program voltage to determine the start program voltage. Alternatively, the offset voltage may be multiplied by a factor before being added to the default start program voltage and/or a guardband voltage may be subtracted to generate the start program voltage. As yet another example, the DSV information may explicitly specify the start program voltage to be used (or a voltage specified by the DSV information may be adjusted to determine the start program voltage). At 610, the upper page(s) are programmed beginning at the determined start program voltage, in a manner similar to that described above.

Figure 7:
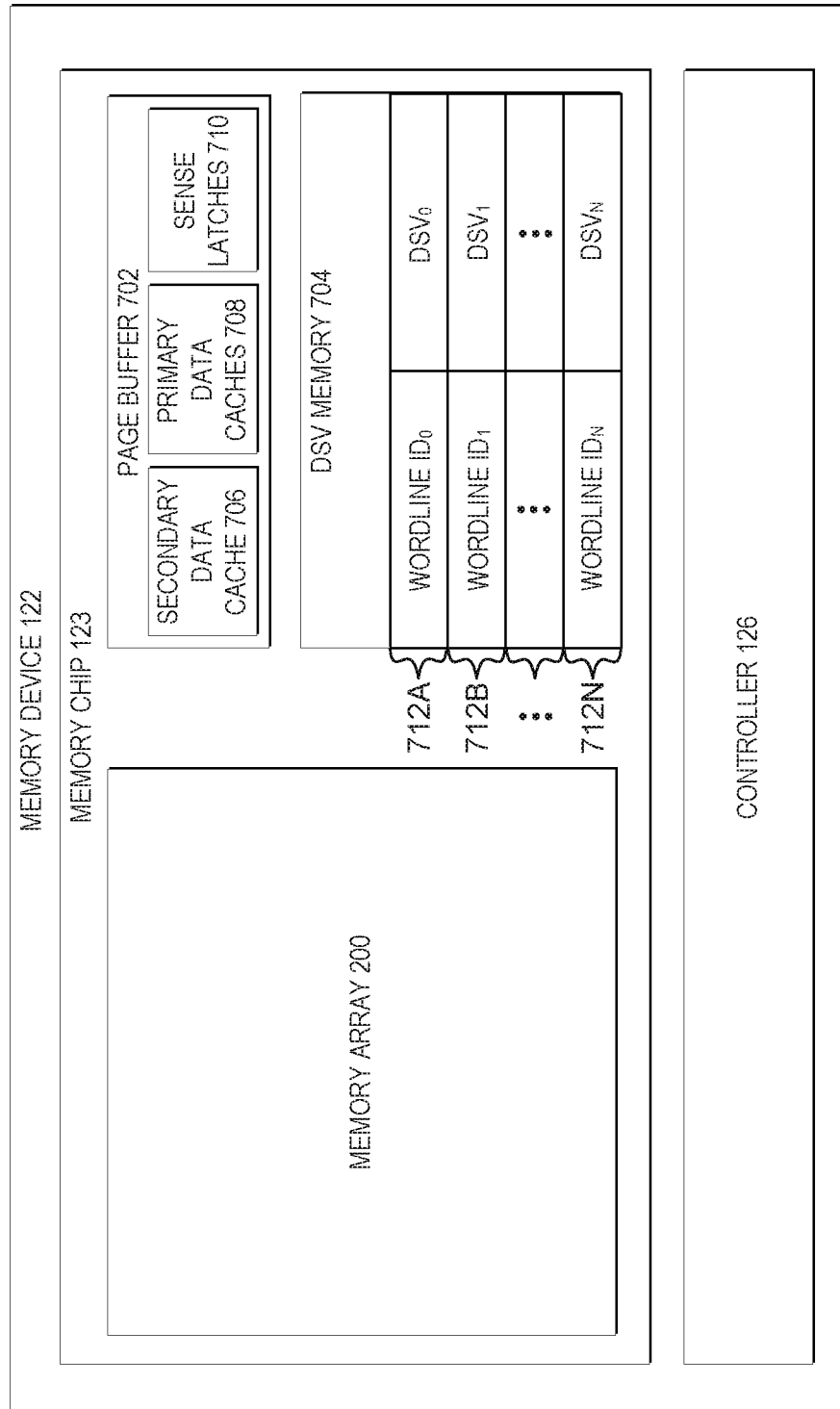
FIG. 7 illustrates an example memory device in accordance with certain embodiments.

FIG. 7 illustrates an example memory device 122 in accordance with certain embodiments. The memory device may comprise at least one memory chip 123 and a controller 126 (in various embodiments, any of the logic of controller 126 may be located on a different chip from memory chip 123 or on the same chip as memory chip 123). In alternative embodiments, each memory chip 123 may include its own controller 126. Each memory chip 123 may include at least one memory array 200, page buffer 702, and DSV memory 704.

The page buffer 702 may include a secondary data cache 706 and primary data caches 708. In a particular embodiment, storage device controller 118 (and/or controller 126) may be coupled to secondary data cache 706 via a bus and may send data to the secondary data cache 706 and receive data stored in the secondary data cache 706. In some embodiments, primary data caches may receive data from the secondary data cache 706 and/or send data to the secondary data cache 706, but may not communicate with storage device controller 118 (and/or controller 126) directly (i.e., the secondary data cache may act as an intermediary between the controllers and the primary data caches). Thus, when the memory chip 123 receives a logical page to be programmed to a physical page of memory array 200, the logical page may be written to the secondary data cache 706 by storage device controller 118 and then transferred to a primary data cache 708 prior to programming, so as to free up the secondary data cache 706 to receive additional logical pages and/or perform other functions. In a particular embodiment utilizing an MLC or TLC scheme, a page buffer may include four different primary data caches, while another particular embodiment utilizing a QLC scheme may include five different primary data caches (though any suitable number of primary data caches 708 may be used in various embodiments). During a programming operation, one of the primary data caches may be used to store values indicating whether corresponding memory cells of the physical page being programmed have passed a verify operation. Page buffer 702 may also include sense latches 710 to store data sensed from the memory array 200.

Memory chip 123 may also include DSV memory 704. DSV memory 704 may include a plurality of entries 712 (e.g., 712A, 712B, ... 712N) that each include an identifier corresponding to a particular portion of memory array 200 and DSV information associated with the identifier. In the embodiment depicted, each identifier corresponds to a different wordline of the memory array 200, thus each instance of DSV information pertains to a corresponding wordline of the memory array 200. Other embodiments contemplate any suitable granularity for the identifiers and corresponding DSV information.

Controller 126 may perform any suitable functionality of memory device 122. In various embodiments, controller 126 may control program and read operations of one or more memory arrays 200 of one or more memory chips 123. Controller 126 may also control access to the DSV memory 704 and the different flows resulting in the writing of the DSV information and the determination of the start program voltages as described herein. In other embodiments, any other suitable logic of the memory device 122 or storage device 106 may perform these functions.

Figure 8:
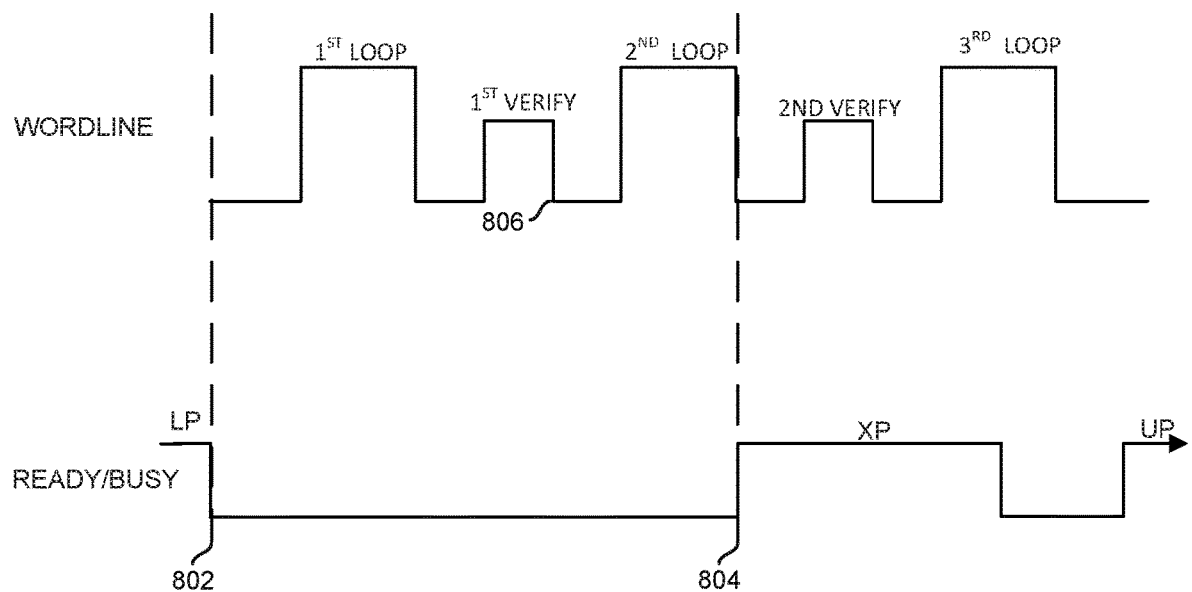
FIG. 8 illustrates an example waveform depicting page caching during a lower page program operation involving dynamic start voltage sampling in accordance with certain embodiments.

FIG. 8 depicts an example waveform pair depicting caching operations during a lower page program operation of a physical page in accordance with certain embodiments. During the program operation depicted, it is assumed that DSV sampling (i.e., the aforementioned comparison of a passing rate with a DSV threshold) is being performed to determine DSV information for the physical page. The top waveform depicts activity on a wordline coupled to the physical page and the bottom waveform depicts a representation of a READY/BUSY signal that specifies when a secondary data cache 706 that communicates with storage device controller 118 is available to receive data from the storage device controller 118. When the READY/BUSY signal is high, the secondary data cache 706 is able to receive data from the controller 118, but when the READY/BUSY signal is low, the secondary data cache 706 is not able to receive data from the controller 118.

In the embodiment depicted, a TLC scheme is used in which an LP is programmed in a first programming pass and a UP and XP are programmed during a second programming pass. Prior to time 802, the LP is communicated from the controller 118 to the secondary data cache 706. The LP is then programmed into the physical page using a series of programming loops and verify operations. During the DSV sampling phase of the programming operation, the secondary data cache 706 may be needed (e.g., to receive the DSV information from controller 126 so that the DSV information may be written into the appropriate DSV cells 404 as part of the programming operation). If the READY/BUSY signal was to go high too early (i.e., if the secondary data cache is released too early), contention between storage device controller 118 and controller 126 may result. Once the DSV information has been transferred from the secondary data cache 706 into a primary data cache for programming into the DSV cells 404, the READY/BUSY signal may again go high at time 804 so that the secondary data cache 706 may receive a UP and an XP for programming into a physical page (which in various embodiments could be the same physical page that was just programmed or a different physical page, such as a page on an adjacent wordline that has already been programmed with LP data). This represents a best case scenario where the pass rate was determined to be greater than the threshold at time 806, after the first program loop and verify operation. Even in the best case scenario, there is significant latency between the caching of the LP data and the caching of the XP data.

Figure 9:
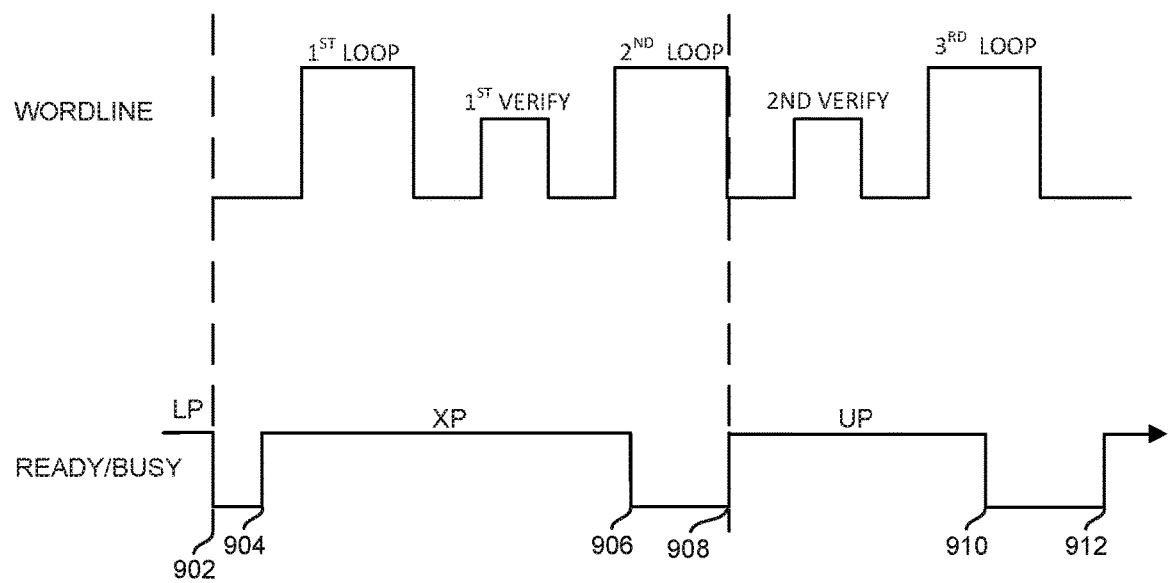
FIG. 9 illustrates an example waveform depicting dual page caching during a lower page program operation in accordance with certain embodiments.

FIG. 9 depicts an example waveform pair depicting dual page caching operations during a lower page program operation of a physical page in accordance with certain embodiments. During the program operation depicted, it is assumed that DSV sampling is not being performed to determine DSV information for the physical page (e.g., because the DSV information is already available for the particular physical page due to DSV sampling performed on a prior physical page, for example, on the same wordline).

The top waveform depicts the activity on a wordline coupled to the physical page and the bottom waveform again depicts a representation of a READY/BUSY signal. Similar to FIG. 8, in the embodiment depicted, a TLC scheme is used in which an LP is programmed in a first programming pass and a UP and XP are programmed during a second programming pass. Prior to time 902, the LP is communicated from the controller 118 to the secondary data cache 706. Between time 902 and 904, the LP data is transferred from the secondary data cache to a primary data cache. The LP is then programmed into the physical page using a series of programming loops and verify operations. Because DSV sampling is not performed during the programming, the secondary data cache becomes available to receive additional data at time 904. Accordingly, at time 904, the XP data is transferred from the storage device controller 118 to the secondary data cache. Between times 906 and 908, the XP data is transferred from the secondary data cache to a primary data cache. At time 908, the UP data is transferred from the storage device controller 118 to the secondary data cache. Between times 910 and 912, the UP data is transferred from the secondary data cache to a primary data cache.

As illustrated, the caching of the UP and XP occurs in parallel with the programming of the LP, thus potentially reducing program time. In various embodiments, while programming lower page(s) on a particular wordline, two or more upper pages may be cached to be programmed into a physical page on an adjacent wordline. This scheme substantially reduces the cost of the first pass program (relative to systems which might independently sample each physical page). This scheme may be adapted for any programming scheme that incurs significant I/O caching latency, such as TLC 2-8, TLC 8-8, QLC 4-16, QLC 8-16, or any other suitable scheme.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 102, external I/O controller 104, processor 108, cores 114A and 114B, I/O controller 110, CPU memory controller 112, storage device 106, system memory device 107, memory 116, memory devices 122, memory chips 123, controllers 126, storage device controller 118, address translation engine 120, program control logic 124, memory array 200, page buffer 702, DSV memory 704, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus comprising a memory comprising a first group of memory cells and a second group of memory cells; and a controller to program one or more lower pages of data to the first group of memory cells; store dynamic start voltage information, the dynamic start voltage information indicative of a rate of programming of at least a portion of the first group of memory cells; determine a start program voltage based on the dynamic start voltage information; and apply the start program voltage to the second group of memory cells during a first program pass of a program operation, the program operation to program one or more lower pages of data to the second group of memory cells.

In an embodiment, the controller is to determine a second start program voltage based on the dynamic start voltage information; and apply the second start program voltage to the second group of memory cells during a first program pass of a second program operation, the second program operation to program one or more upper pages of data to the second group of memory cells. In an embodiment, the start program voltage is based at least in part on a program loop count of the dynamic start voltage information and a program voltage step. In an embodiment, the second start program voltage is based at least in part on a program loop count of the dynamic start voltage information and a program voltage step. In an embodiment, the controller is to write the dynamic start voltage information into a plurality of memory cells coupled to a wordline that is also coupled to the first group of memory cells. In an embodiment, the controller is to write the dynamic start voltage information into a volatile memory; and write the dynamic start voltage information into a plurality of memory cells coupled to a wordline that is also coupled to the second group of memory cells, the plurality of memory cells located in the same memory subblock as the second group of memory cells. In an embodiment, the controller is to program the dynamic start voltage information into the plurality of memory cells in parallel with the program operation to program one or more lower pages of data to the second group of memory cells. In an embodiment, the controller is to determine that dynamic start voltage information is not available for the first group of memory cells; and determine and store dynamic start voltage information for the first group of memory cells based on the determination that dynamic start voltage information is not available for the first group of memory cells. In an embodiment, the controller is to use the start program voltage for each physical page of a wordline coupled to the first group of memory cells and the second group of memory cells. In an embodiment, the first group of memory cells and the second group of memory cells are coupled to the same wordline. In an embodiment, the memory comprises a page buffer to receive at least a portion of an upper page into a cache in parallel with at least a portion of the first program pass of the program operation. In an embodiment, an apparatus comprises a battery communicatively coupled to a processor, a display communicatively coupled to the processor, or a network interface communicatively coupled to the processor.

In at least one embodiment, a method comprises programming one or more lower pages of data to a first group of memory cells; storing dynamic start voltage information, the dynamic start voltage information indicative of a rate of programming of at least a portion of the first group of memory cells; determining a start program voltage based on the dynamic start voltage information; and applying the start program voltage to a second group of memory cells during a first program pass of a program operation, the program operation to program one or more lower pages of data to the second group of memory cells.

In an embodiment, a method further comprises determining a second start program voltage based on the dynamic start voltage information; and applying the second start program voltage to the second group of memory cells during a first program pass of a second program operation, the second program operation to program one or more upper pages of data to the second group of memory cells. In an embodiment, the start program voltage is based at least in part on a program loop count of the dynamic start voltage information and a program voltage step. In an embodiment, the second start program voltage is based at least in part on a program loop count of the dynamic start voltage information and a program voltage step. In an embodiment, a method comprises writing the dynamic start voltage information into a plurality of memory cells coupled to a wordline that is also coupled to the first group of memory cells. In an embodiment, a method further comprises writing the dynamic start voltage information into a volatile memory; and writing the dynamic start voltage information into a plurality of memory cells coupled to a wordline that is also coupled to the second group of memory cells, the plurality of memory cells located in the same memory subblock as the second group of memory cells. In an embodiment, a method further comprises programming the dynamic start voltage information into the plurality of memory cells in parallel with the program operation to program one or more lower pages of data to the second group of memory cells. In an embodiment, a method further comprises determining that dynamic start voltage information is not available for the first group of memory cells; and determining and storing dynamic start voltage information for the first group of memory cells based on the determination that dynamic start voltage information is not available for the first group of memory cells. In an embodiment, a method further comprises using the start program voltage for each physical page of a wordline coupled to the first group of memory cells and the second group of memory cells. In an embodiment, the first group of memory cells and the second group of memory cells are coupled to the same wordline. In an embodiment, a method further comprises receiving, at a page buffer, at least a portion of an upper page into a cache in parallel with at least a portion of the first program pass of the program operation.

In at least one embodiment, at least one machine readable storage medium has instructions stored thereon, the instructions when executed by a machine to cause the machine to program one or more lower pages of data to a first group of memory cells; store dynamic start voltage information, the dynamic start voltage information indicative of a rate of programming of at least a portion of the first group of memory cells; determine a start program voltage based on the dynamic start voltage information; and; apply the start program voltage to a second group of memory cells during a first program pass of a program operation, the program operation to program one or more lower pages of data to the second group of memory cells.

In an embodiment, the instructions when executed cause the machine to determine a second start program voltage based on the dynamic start voltage information; and apply the second start program voltage to the second group of memory cells during a first program pass of a second program operation, the second program operation to program one or more upper pages of data to the second group of memory cells. In an embodiment, the start program voltage is based at least in part on a program loop count of the dynamic start voltage information and a program voltage step. In an embodiment, the instructions when executed cause the machine to write the dynamic start voltage information into a plurality of memory cells coupled to a wordline that is also coupled to the first group of memory cells. In an embodiment, the instructions when executed to cause the machine to write the dynamic start voltage information into a volatile memory; and write the dynamic start voltage information into a plurality of memory cells coupled to a wordline that is also coupled to the second group of memory cells, the plurality of memory cells located in the same memory subblock as the second group of memory cells.

In at least one embodiment, a system comprises means to program one or more lower pages of data to a first group of memory cells; means to store dynamic start voltage information, the dynamic start voltage information indicative of a rate of programming of at least a portion of the first group of memory cells; means to determine a start program voltage based on the dynamic start voltage information; and means to apply the start program voltage to a second group of memory cells during a first program pass of a program operation, the program operation to program one or more lower pages of data to the second group of memory cells.

In an embodiment, the system further comprises means to determine a second start program voltage based on the dynamic start voltage information; and means to apply the second start program voltage to the second group of memory cells during a first program pass of a second program operation, the second program operation to program one or more upper pages of data to the second group of memory cells. In an embodiment, the start program voltage is based at least in part on a program loop count of the dynamic start voltage information and a program voltage step. In an embodiment, the system further comprises means to write the dynamic start voltage information into a plurality of memory cells coupled to a wordline that is also coupled to the first group of memory cells. In an embodiment, the system further comprises means to write the dynamic start voltage information into a volatile memory; and means to write the dynamic start voltage information into a plurality of memory cells coupled to a wordline that is also coupled to the second group of memory cells, the plurality of memory cells located in the same memory subblock as the second group of memory cells.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a memory comprising a first group of memory cells of a first subblock and a second group of memory cells of a second subblock, wherein the first group of memory cells and the second group of memory cells are coupled to the same wordline; and
   a controller comprising circuitry, the controller to:
   program one or more pages of data to the first group of memory cells of the first subblock by applying a series of program voltages to the wordline;
   determine a start program voltage based on a rate of programming of at least a portion of the first group of memory cells; and
   apply the start program voltage to the wordline during a first program pass of a program operation, the program operation to program one or more pages of data to the second group of memory cells of the second subblock.

2. The apparatus of claim 1, the controller to apply the start program voltage to the wordline during a first program pass of a second program operation, the second program operation to program one or more pages of data to a third group of memory cells of a third subblock.

3. The apparatus of claim 1, wherein the memory comprises a third group of memory cells of the first subblock and a fourth group of memory cells of the second subblock, and wherein the controller is to:
   program one or more pages of data to the third group of memory cells of the first subblock by applying a second series of program voltages to a second wordline;
   determine a second start program voltage based on a rate of programming of at least a portion of the third group of memory cells; and
   apply the second start program voltage to the second wordline during a first program pass of a second program operation, the second program operation to program one or more pages of data to the fourth group of memory cells of the second subblock.

4. The apparatus of claim 1, wherein the start program voltage is based at least in part on a program loop count and a program voltage step.

5. The apparatus of claim 1, the controller to write dynamic start voltage information indicative of the rate of programming of the at least a portion of the first group of memory cells into a plurality of memory cells coupled to the wordline.

6. The apparatus of claim 5, the controller to:
   write the dynamic start voltage information into a volatile memory; and
   write the dynamic start voltage information from the volatile memory into the plurality of memory cells coupled to the wordline.

7. The apparatus of claim 1, the controller to:
   determine that dynamic start voltage information indicative of the rate of programming of the at least a portion of the first group of memory cells is not available; and
   determine and store the dynamic start voltage information based on the determination that the dynamic start voltage information is not available.

8. The apparatus of claim 7, wherein the dynamic start voltage information comprises the start program voltage.

9. The apparatus of claim 1, wherein the memory comprises a page buffer to receive at least a portion of an upper page into a cache in parallel with at least a portion of the first program pass of the program operation.

10. The apparatus of claim 1, further comprising a battery communicatively coupled to a processor, a display communicatively coupled to the processor, or a network interface communicatively coupled to the processor.

11. The apparatus of claim 1, wherein the first group of memory cells and the second group of memory cells are non-volatile memory cells.

12. A method comprising:
programming one or more pages of data to a first group of memory cells of a first subblock of a memory by applying a series of program voltages to a wordline;
determining a start program voltage based on a rate of programming of at least a portion of the first group of memory cells; and
applying the start program voltage to the wordline during a first program pass of a program operation, the program operation to program one or more pages of data to a second group of memory cells of a second subblock of the memory.

13. The method of claim 12, further comprising applying the start program voltage to the wordline during a first program pass of a second program operation, the second program operation to program one or more pages of data to a third group of memory cells of a third subblock of the memory.

14. The method of claim 12, further comprising:
programming one or more pages of data to a third group of memory cells of the first subblock of the memory by applying a second series of program voltages to a second wordline;
determining a second start program voltage based on a rate of programming of at least a portion of the third group of memory cells; and
applying the second start program voltage to the second wordline during a first program pass of a second program operation, the second program operation to program one or more pages of data to a fourth group of memory cells of the second subblock of the memory.

15. The method of claim 12, further comprising:
determining that dynamic start voltage information indicative of the rate of programming of the at least a portion of the first group of memory cells is not available; and
determining and storing the dynamic start voltage information based on the determination that the dynamic start voltage information is not available.

16. The method of claim 15, wherein the dynamic start voltage information comprises the start program voltage.

17. The method of claim 12, wherein the first group of memory cells and the second group of memory cells are non-volatile memory cells.

18. At least one non-transitory machine readable storage medium comprising:
instructions stored on the medium, the instructions when executed by a machine to cause the machine to:
program one or more pages of data to a first group of memory cells of a first subblock of a memory by applying a series of program voltages to a wordline;
determine a start program voltage based on a rate of programming of at least a portion of the first group of memory cells; and
apply the start program voltage to the wordline during a first program pass of a program operation, the program operation to program one or more pages of data to a second group of memory cells of a second subblock of the memory.

19. The at least one medium of claim 18, the instructions when executed to cause the machine to apply the start program voltage to the wordline during a first program pass of a second program operation, the second program operation to program one or more pages of data to a third group of memory cells of a third subblock of the memory.

20. The at least one medium of claim 18, the instructions when executed to cause the machine to:
program one or more pages of data to a third group of memory cells of the first subblock of the memory by applying a second series of program voltages to a second wordline;
determining a second start program voltage based on a rate of programming of at least a portion of the third group of memory cells; and
apply the second start program voltage to the second wordline during a first program pass of a second program operation, the second program operation to program one or more pages of data to a fourth group of memory cells of the second subblock of the memory.

* * * * *